(12) United States Patent
Rausch et al.

(10) Patent No.: US 7,536,618 B2
(45) Date of Patent: May 19, 2009

(54) WIDE FREQUENCY RANGE SIGNAL GENERATOR AND METHOD, AND INTEGRATED CIRCUIT TEST SYSTEM USING SAME

(75) Inventors: Greg Rausch, Plymouth, MN (US); Rob Rabe, Chanhassen, MN (US); Jake Klier, Blaine, MN (US)

(73) Assignee: Micron Technology, Inc., Boise, ID (US)

(*) Notice: Subject to any disclaimer, the term of this patent is extended or adjusted under 35 U.S.C. 154(b) by 425 days.

(21) Appl. No.: 11/442,515

(22) Filed: May 25, 2006

(65) Prior Publication Data

US 2007/0300111 A1 Dec. 27, 2007

(51) Int. Cl.
*G01R 31/28* (2006.01)
(52) U.S. Cl. .................................................. 714/731
(58) Field of Classification Search .................. 714/731
See application file for complete search history.

(56) References Cited

U.S. PATENT DOCUMENTS

| | | | |
|---|---|---|---|
| 4,331,926 A * | 5/1982 | Minakuchi | 377/110 |
| 4,461,582 A * | 7/1984 | Walther | 368/201 |
| 4,553,218 A * | 11/1985 | Genrich | 708/103 |
| 5,087,829 A * | 2/1992 | Ishibashi et al. | 327/152 |
| 5,365,121 A * | 11/1994 | Morton et al. | 327/170 |
| 6,559,697 B2 * | 5/2003 | Kikuchi | 327/156 |
| 6,614,865 B1 * | 9/2003 | Ishimi | 375/373 |
| 7,006,415 B2 * | 2/2006 | Hou et al. | 369/52.1 |
| 7,205,847 B2 * | 4/2007 | Chen et al. | 331/11 |
| 7,286,568 B2 * | 10/2007 | Christiansen | 370/509 |
| 7,298,810 B2 * | 11/2007 | Ke | 377/48 |
| 7,304,513 B2 * | 12/2007 | Chatterjee et al. | 327/115 |

* cited by examiner

*Primary Examiner*—James C Kerveros
(74) *Attorney, Agent, or Firm*—Dorsey & Whitney LLP (57) ABSTRACT

A signal generator produces an output clock signal by coupling an input clock signal through a plurality of divider circuits each of which is formed by a toggling flip-flop. The frequency of the output clock signal is adjusted by selecting the flip-flop to which the input clock signal is coupled. Retimer flip-flops may be coupled between adjacent flip-flips to resynchronize the signal being coupled through the flip-flops. Each of the retimer flip-flops receives a respective signal from the output of an upstream flip-flop at its data input, and it receives the input clock signal at its clock input. The flip-flop then applies the signal to a downstream flip-flop in synchronism with the input clock signal. The final two flip-flops through which the input signal is coupled may be preset to various states to set the phase of the output clock signal to one of four phases.

67 Claims, 7 Drawing Sheets

WIDE FREQUENCY RANGE SIGNAL GENERATOR AND METHOD, AND INTEGRATED CIRCUIT TEST SYSTEM USING SAME

TECHNICAL FIELD

This invention relates to generating signals for testing and other purposes, and, more particularly, to a system and method for generating a periodic signal over a wide range of frequencies for testing integrated circuits and for other purposes.

BACKGROUND OF THE INVENTION

During the fabrication of integrated circuits such as memory devices, it is conventional to test such integrated circuits at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board that are connected to the integrated circuits. The test head is connected through a cable to a high-speed tester so that the tester can apply signals to and receive signals from the integrated circuits.

During the testing of integrated circuits, it is often necessary to supply a periodic signal, such as a clock signal, to the integrated circuit. The frequency of the periodic signal is determined by the nature of the integrated circuit. It is sometimes necessary to apply a periodic signal to an integrated circuit having a frequency that varies over a wide range. For example, during speed grading of integrated circuits, such as memory devices, it is necessary to increase the frequency of a clock signal from an initial frequency to a frequency that is high enough for the integrated circuit to no longer function properly. Additionally, it is often desirable to supply several different phases of a periodic signal, such as an in-phase periodic signal and a quadrature periodic signal. For example, it may be necessary to apply data signals to a memory device in synchronism with an in-phase periodic signal, and to apply a write strobe signal to the memory device at the quadrature of the in-phase signal. It is also sometimes necessary in applications other than testing to provide periodic signals at one or more phases that vary over a wide range of frequencies.

A variety of techniques have been used to generate periodic signals having a variable frequency. Voltage controlled oscillators ("VCOs") using a variety of designs both analog and digital are frequently used. The frequency of a periodic signal generated by a VCO can be varied by simply varying the magnitude of a control voltage applied to a control input of a VCO. Conventional VCO designs can also generate periodic signals at several different phases.

Another approach to generating a periodic signal having a variable frequency is to use a phase-lock loop ("PLL"). A phase-lock loop also uses a VCO, but the phase of the signal generated by the VCO is compared with the phase of a reference signal using a phase detector. The phase detector generates an error signal having a magnitude corresponding to a difference in phase between the two signals, and this error signal is used to adjust the frequency (i.e., change in phase with time) of the signal generated by the VCO. The periodic signal generated by the VCO and the reference signal will, of course, have the same frequency if their phases are kept equal to each other. The frequency of the signal generated by the VCO can be varied by coupling the periodic signal from the VCO to the phase detector through a divider circuit that divides the frequency of the periodic signal by a variable number N. The periodic signal generated by the VCO will then have a frequency of $N*f_0$, where $f_0$ is the frequency of the reference signal.

The use of a VCO, either alone or as part of a PLL, has the advantage of being relatively simple and using a relatively little amount of circuitry. However, conventional VCO's are generally able to operate over only a limited range of frequencies. Many applications require that the frequency of a periodic signal be varied over a range that is wider than the range of frequencies that can be achieved using a VCO.

Another approach is to use a bank of VCOs, each of which operates over a limited range of frequencies. While this approach addresses the shortcomings of using a single VCO, it results in a relatively complex and expensive solution to the limitations inherent in using a single VCO.

There is therefore a need for a relatively simple and inexpensive system and method that is able to generate a periodic signal over a wide range of frequencies, and preferably at several different phases.

SUMMARY OF THE INVENTION

A forward divider circuit used to generate an output clock signal from an input clock signal may be used in a variety of applications for generating a clock signal for testing integrated circuits. The forward divider circuit includes a divider chain formed by a plurality of divider circuits coupled in series with each other from a first divider circuit to a last divider circuit. The divider chain generates the output clock signal with a frequency determined by the frequency of the input clock signal and the number of the divider circuits through which the input clock signal is coupled. According to one aspect of the invention, at least one retimer circuit is coupled between at least two of the divider circuits. The retimer circuit receives a signal from the output of a first divider circuit and couples the signal to the input of a second divider circuit. The signal is coupled to the second divider circuit in synchronism with a retimer signal, which may be the input clock signal. According to another aspect of the invention, the divider chain adjusts the phase of the output clock signal to one of a plurality of different phase values. The divider chain can perform this function by presetting at least one of the divider circuits to a respective state prior to coupling the input clock signal through the divider circuits.

DETAILED DESCRIPTION OF THE INVENTION

Figure 1:
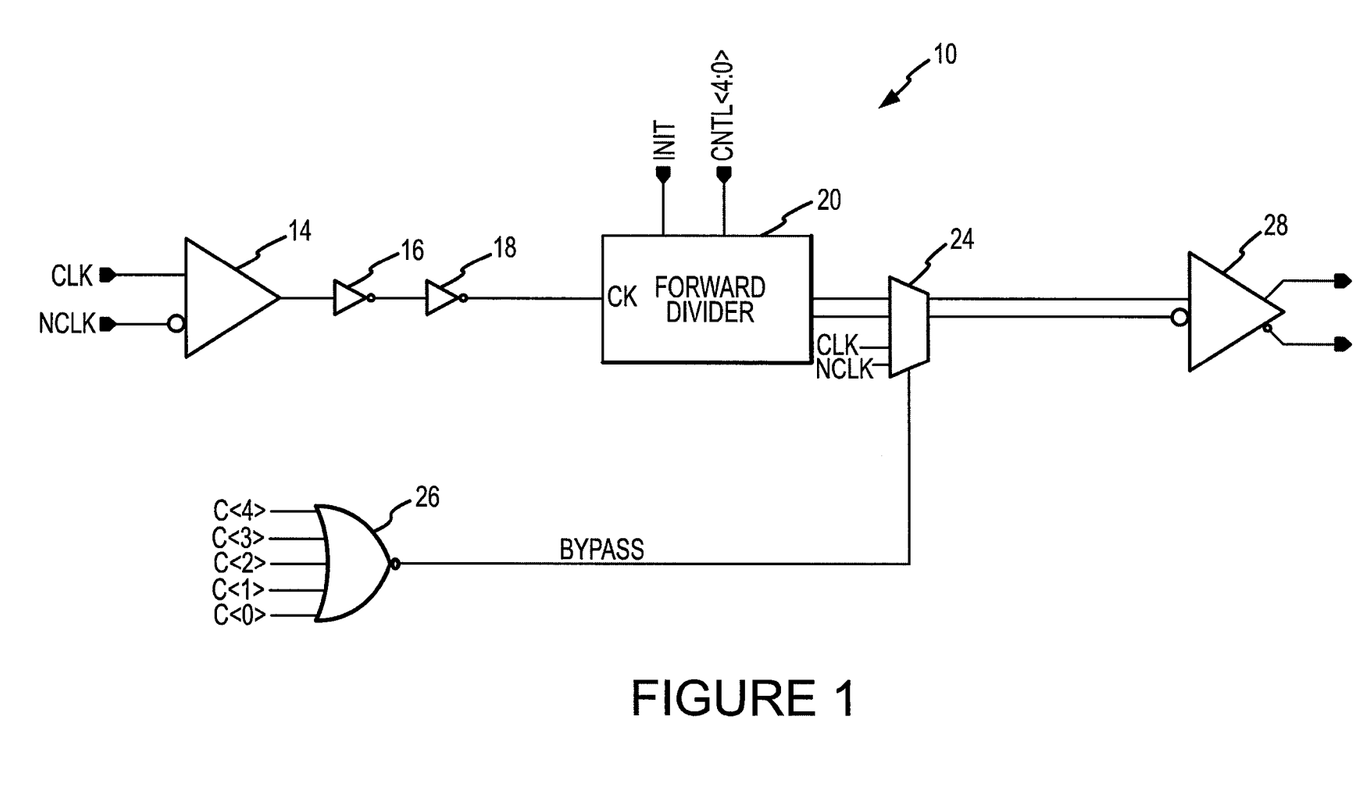
FIG. 1 is a block diagram of a periodic signal generator according to one example of the invention.

A periodic signal generator 10 according to one example of the invention is shown in FIG. 1. The signal generator 10 includes a differential amplifier 14 receiving complimentary clock signals CLK, nCLK and generating a corresponding single-ended output signal. (Signal names used herein that are prefaced by a "n" are active low). Because of capacitance and attenuation in a signal line coupling the CLK and nCLK signals to the amplifier 14, the CLK and nCLK signals may not fully transition between logic levels. The differential amplifier 14 amplifies the CLK and nCLK signals so that the signal at the output of the amplifier 14 fully transitions between logic levels, such as ground and a supply voltage $V_{CC}$. In another example of the signal generator 10, a single ended clock signal is applied to either a buffer (not shown) or one input of the amplifier 14, with the other input being connected to ground.

The output of the differential amplifier 14 is coupled through two inverters 16, 18, which are used to increase the drive of the periodic signal output from the differential amplifier 14. The output of the inverter 18 is applied to the clock "CK" input of a forward divider circuit 20. The forward divider circuit 20 also receives an initialization signal INIT and a 5-bit command C<4:0>. As explained in greater detail below, the forward divider circuit 20 performs the function of generating an output signal resulting from dividing the frequency of the signal applied to the CK input by either 1, 2, 4, 8, 16, 32 or 64. Furthermore, the phase of the output signal can be at either 0, 90, 180, or 270 degrees. The particular divider value is determined by the three most significant bits of the command, i.e., C<4:2>, and the phase of the output signal is determined by the two least significant bits of the command, i.e., C<1:0>.

The relationship between the command bits and the divider values are shown in Table 1 as follows:

TABLE 1

| C<4:2> | Divider Value |
|---|---|
| "0 0 0" | 1 |
| "0 0 1" | 2 |
| "0 1 0" | 4 |
| "0 1 1" | 8 |
| "1 0 0" | 16 |
| "1 0 1" | 32 |
| "1 1 0" | 64 |

The relationship between the command bits and the phases of the output signal are shown in Table 2 as follows:

TABLE 2

| C<1:0> | Phase |
|---|---|
| "0 0" | 0 |
| "0 1" | 90 |
| "1 0" | 180 |
| "1 1" | 270 |

For example, with an input signal having a frequency of 64 mHz, a command of "1 0 1 1 0" will result in an output signal having a frequency of 2 mHz (64 mHz/32) and a phase of 180 degrees.

The output of the forward divider circuit 20 is a differential output signal that is applied to a first pair of inputs to a multiplexer 24. A second pair of inputs to the multiplexer 24 receive the CLK and nCLK signals that are applied to the input of the differential amplifier 14. The operation of the multiplexer 24 is controlled by a BYPASS signal. The BYPASS signal is generated by a NOR-gate 26, which decodes a "divider value=1" command C<4:2> of "0 0 0" and a "0 phase" command C<1:0> of "0 0. The multiplexer 24 couples the output of the forward divider circuit 20 to its output except for when the BYPASS signal is generated. For a "divide value=1" command with no phase shift, the forward divider circuit 20 is not needed, so a high BYPASS signal couples the CLK and nCLK signals directly to the output of the multiplexer 24. The output of the multiplexer 24 is applied to complimentary inputs of a differential amplifier 28, which generates a corresponding differential output signal.

The INIT signal is applied to the forward divider circuit 20 during an initialization phase before a periodic signal is to be generated by the forward divider circuit 20. The INIT signal resets divider stages to a known state, as will be described with reference to FIGS. 4 and 5.

Figure 2:
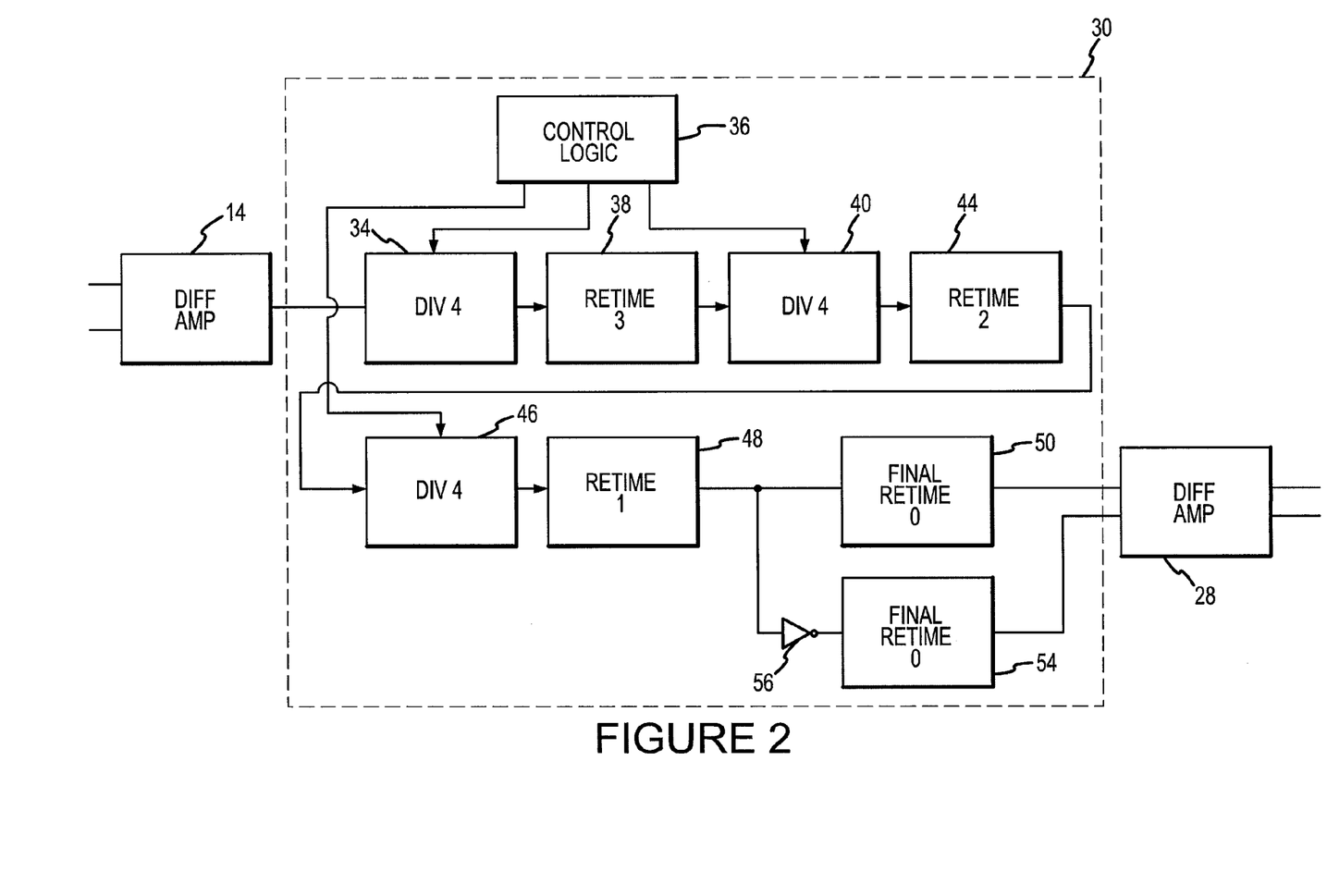
FIG. 2 is a block diagram of a periodic signal generator according to another example of the invention.

One example of a forward divider circuit 30 in accordance with the invention is shown in greater detail in FIG. 2. The single-ended output of the differential amplifier 14 is applied to the input of a first divide by 4 circuit 34, which receives a command from control logic 36. The control logic 36 generates the control signals based on the previously described commands C<4:0>. If the command is for a divide of either 64 or 32, the divider circuit 34 divides the frequency of the input signal by either 4 or 2, respectively. Otherwise, the signal applied to the input of the circuit 34 is applied directly to its output.

The output of the divider circuit 34 is applied to a retimer circuit 38. The function of the retimer circuit is to synchronize transitions of the output of the divider circuit 34 with transitions of the input signal applied to the circuit 34. As a result, the signal generated by the divider circuit 34 transitions at the same time as a transition of the CLK and nCLK signals.

The output of the retimer circuit 38 is applied to a second divider circuit 40, which performs the same function as the divider circuit 34. The divider circuit 40 is controlled by the control signals received from the control logic 36, which, as previously explained, correspond to the commands C<4:0>. The divider circuit 40 divides the signal from the retimer circuit 38 by 4 in response to a command to divide the CLK signal by 64, 32 or 16, and it divides the signal from the retimer circuit 38 by 2 in response to the command to divide the CLK signal by 8. If the command received from the control logic 36 is to divide the CLK signal by 4, 2 or 1, the divider circuit 40 couples the input of the divider circuit 40 directly to its output. The output of the divider circuit 40 is again applied to a retimer circuit 44, which insures that transitions of the signal from the divider 40 are re-synchronized to transitions of the CLK and nCLK signals.

The output of the retimer circuit 44 is coupled through a third divide by four circuit 46 and a third retimer 48, which function in the same manner as the divider circuit 34, 40 and the retimers 38, 44, respectively. The divider circuit 46 divides the signal from the retimer circuit 44 by 4 in response to control signals from the control logic 36 corresponding to commands to divide the CLK signal by 64, 32, 16, 8 or 4. The divider circuit 46 divides the signal from the retimer circuit 44 by 2 in response to a command to divide the CLK signal by 2. In response to a command to divide the CLK signal by 1, the divider circuit 46 couples its input directly to its output. However, the divider circuit 46 also receives control signals from the control logic 36 corresponding to commands indicating the phase of the signal output from the divider circuit 46. Therefore, regardless of the number of times the CLK and nCLK signals are divided, the divider circuit 46 adjusts the phase of the signal applied to the retimer 48 accordingly.

The output of the retimer circuit 48 is applied to a final retimer circuit 50 and to a complementary final retimer circuit 54 through an inverter 56. The final retimer circuits 50, 54 receive the CLK signal through a path having very little buffering (not shown) so that the transitions of the complimentary signals at the output of the retimer circuits 50, 54 are more closely synchronized to the transitions of the CLK and nCLK signals. The output of the retimer circuits 50, 54 are applied to the inputs of the differential amplifier 28 (FIG. 1), as described above.

Figure 3:
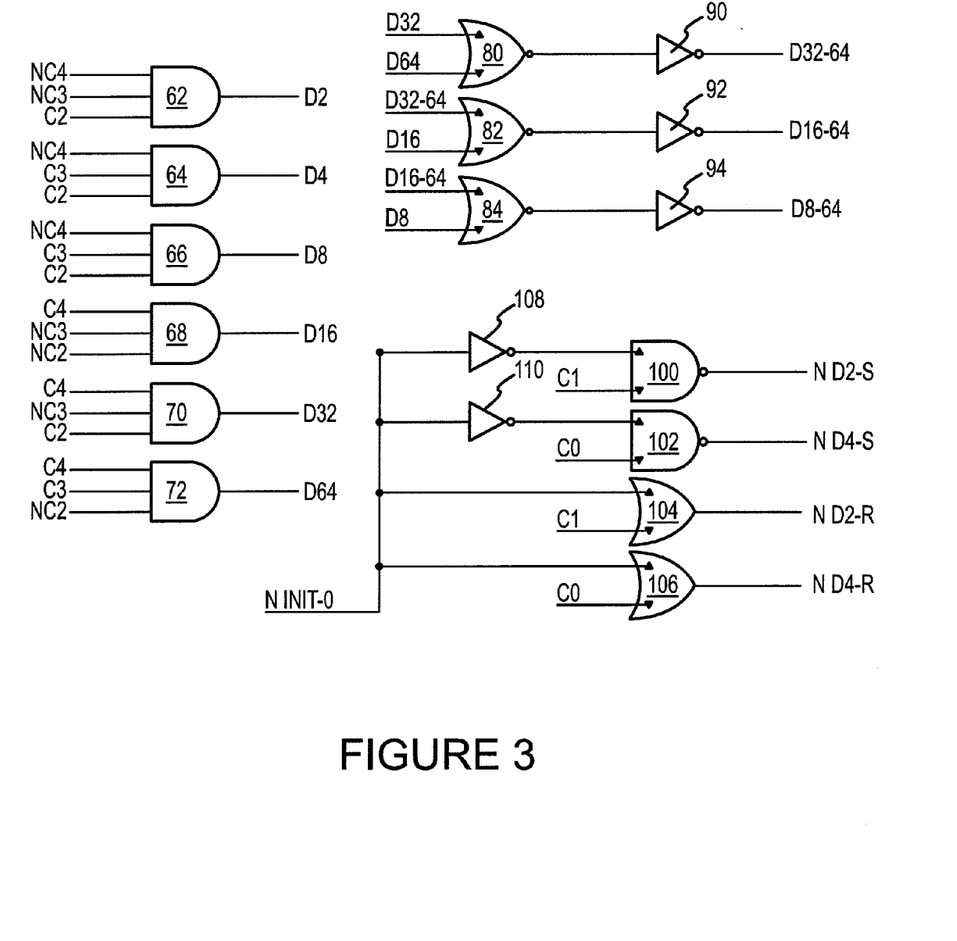
FIG. 3 is a logic diagram of control logic used in a periodic signal generator shown in FIGS. 3-5 in accordance with another example of the invention.
Figure 4:
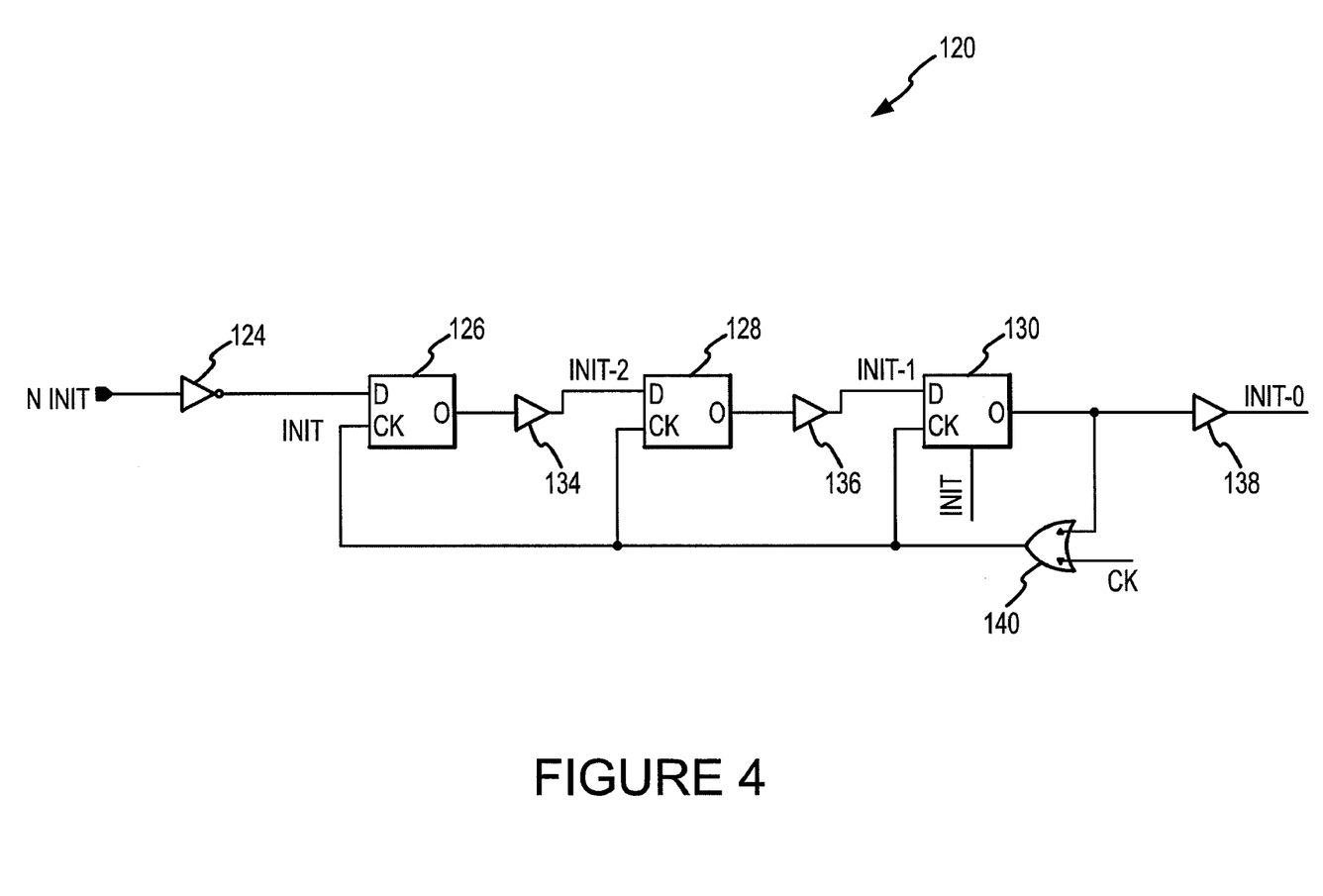
FIG. 4 is a logic diagram of an initialization circuit used in the periodic signal generator of FIGS. 3-5.
Figure 5:
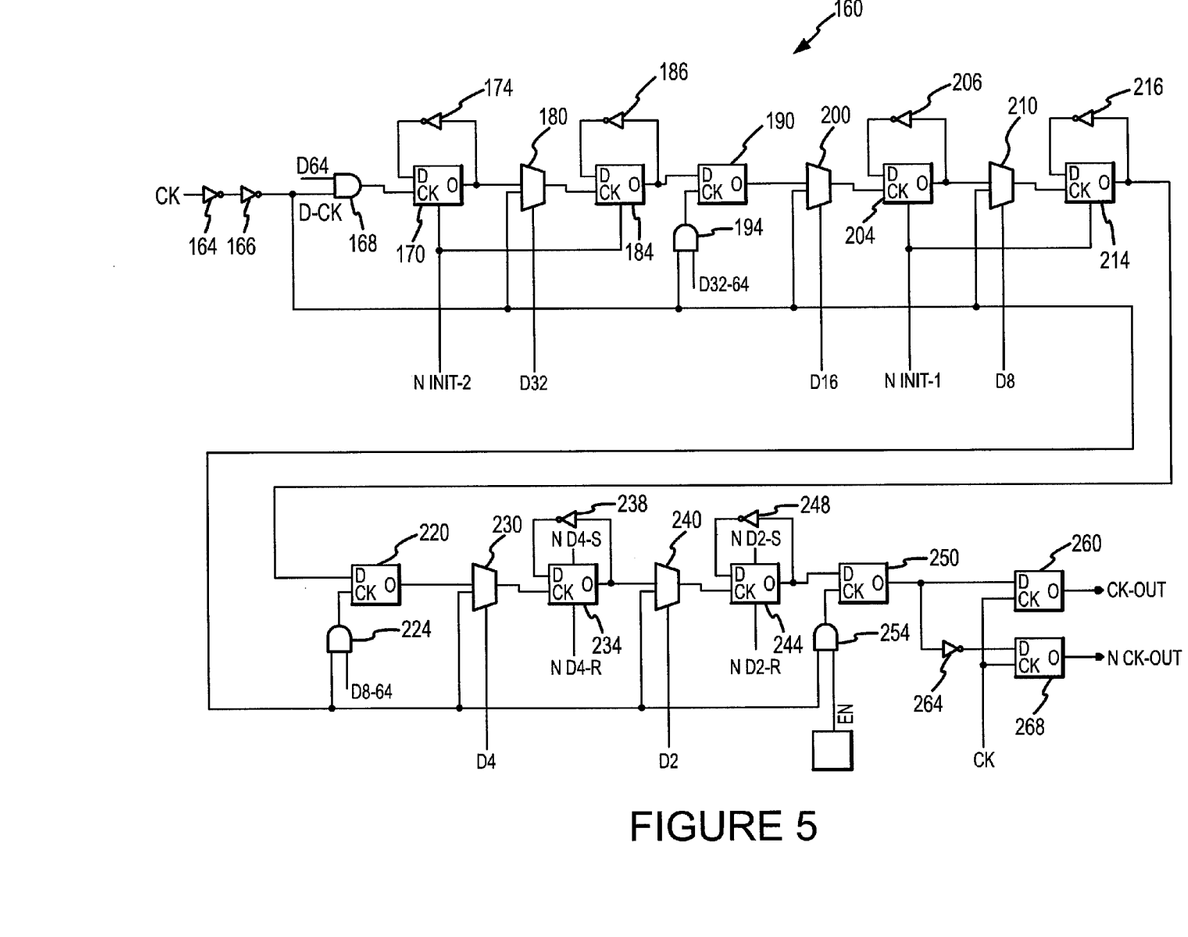
FIG. 5 is a logic diagram of a divider chain used in the periodic signal generator of FIGS. 3-5.

Another example of a forward divider circuit in accordance with the invention is illustrated in FIGS. 3-5. A control logic circuit 60 is shown in FIG. 3 is similar to the control logic 36 shown in FIG. 2 in that it also generates control signals from the command C<4:0>. The control logic 60 includes a first set of AND gates 62-72 that decode the high order bits C<4:2> corresponding to the divider values. The gates 62 decode the high order command bits C<4:2> as shown in Table 3 as follows:

TABLE 3

| C<4:2> | Divide | AND gate |
|---|---|---|
| "0 0 1" | 2 | 62 |
| "0 1 0" | 4 | 64 |
| "0 1 1" | 8 | 66 |
| "1 0 0" | 16 | 68 |
| "1 0 1" | 32 | 70 |
| "1 1 0" | 64 | 72 |

A set of OR-gates 80-84 and corresponding inverters 90-94 decode specific ranges of divider values. The OR-gate 80 decodes a divider value of either 32 or 64 to produce an active high D32-64 signal. The OR-gate 82 receives the D32-64 signal as well as the D16 signal indicative of a divider value of 16 to cause the inverter 92 to output a D16-64 that is high responsive to a divider value between 16 and 64. Finally, the OR-gate 84 and the inverter 94 output a D8-64 signal that is high responsive to a divider value between 8 and 64.

A final set of two NAND-gates 100,102 and two OR-gates 104, 106 decode the low order command bits C<1:0>, which, as previously explained, control the phase of the signal generated by the forward divider circuit. These bits are decoded as shown in the following Table 4:

TABLE 4

| C<1:0> | Phase | Active Low |
|---|---|---|
| 0 0 | 0 | nD4-R and nD2-R |
| 0 1 | 90 | nD4-S and nD2-R |
| 1 0 | 180 | nD4-R and nD2-S |
| 1 1 | 270 | nD4-S and nD2-S |

As explained in greater detail below, the low order command bits C<1:0> allow the forward divider circuit to output a signal having a phase of either 0 or 180 degrees for a divider value of 2, and a phase of either 0, 90, 180, or 270 degrees for a divider value of between 4 and 64.

The forward divider circuit of FIGS. 3-5 also includes an initialization circuit 120, which is shown in FIG. 4. The initialization circuit 120 receives an active low nINIT signal that is coupled through an inverter 124 and three flip-flops 126, 128, 130. A first driver 134 is connected between the output of the flip-flop 126 and the data input of the flip-flop 128, and a second driver 136 is connected between the output of the flip-flop 128 and the data input of the flip-flop 130. A third driver 138 is connected to the output of the flip-flop 130. Finally, the clock inputs of the flip-flops 126-130 are connected to the output of an OR-gate 140, which has a first input receiving the clock signal CK applied to the forward divider circuit and a second input connected to the output of the flip-flop 130.

In operation, the inactive high nINIT signal causes the inverter 124 to output a low INIT signal, which is applied to the data input of the flip-flop 126. The high nINIT signal also maintains the flip-flop 130 in a reset condition. The low INIT signal at the output of the flip-flop 130 enables the CK signal to be coupled through the OR-gate 140. The rising edge transitions the CK signal clock to the low INIT signal through each of the flip-flops 126-130. Therefore, prior to beginning the initialization sequence, each of the flip-flops 126-130 output a low INIT signal.

When the nINIT signal transitions active low, the INIT signal transitions high to apply a high to the D input of the flip-flop 126 and to remove the reset from the flip-flop 130. On the next rising edge of the CK signal, the high is clocked to the output of the flip-flop 126, thereby causing the INIT-2 signal to transition high. On the next rising edge of the CK signal, the high INIT-2 signal is clocked to the output of the flip-flop 128, thereby transitioning the INIT-1 signal high. Finally, on the next rising edge of the CK signal, the high INIT-1 signal is clocked to the output of the flip-flop 130, thereby transitioning the INIT-0 signal high. The high output of the flip-flop 130 also disables the OR-gate 140 so that all of the INIT signals remain high. When the nINIT signal subsequently transitions inactive high, the resulting low INIT signal resets the flip-flop 130 thereby enabling the NOR-gate 140. The low INIT signal is then sequentially clocked to each of the flip-flops 126-130, as previously explained. In summary, in response to the active low nINIT signal, the INIT-2, INIT-1 and INIT-0 signals transition high in sequence responsive to each period of the CK signal.

The remaining circuitry used in the forward divider circuit of FIGS. 3-5 is a divider chain 160, which is shown in FIG. 5. The periodic clock signal CK, which may be received from the differential amplifier 14 (FIG. 1), is coupled through a pair of inverters 164, 166 to generate a divider clock signal D-CK. The D-CK signal is coupled to an input of an AND-gate 168. Another input of the AND-gate 168 receives the D64 signal from the control logic circuit 60 shown in FIG. 3. It will be recalled that the D64 signal is active high responsive to a command for a divider value of 64. Therefore, when the divider value is 64, the D-CK signal is coupled to the clock input of a flip-flop 170. The output of the flip-flop 170 is coupled through an inverter 174 to the data D input of the flip-flop 170 to cause the flip-flop 170 to toggle. Therefore, the output of the flip-flop 170 changes state with each rising edge of the signal applied to its clock input. The flip-flop 170 is also reset by an active high INIT-2 signal first generated by the initialization circuit 120 (FIG. 4).

The output of the flip-flop 170 is applied to one input of a multiplexer 180, which receives the D-CK signal at its other input. The multiplexer 180 is controlled by the D32 signal from the control logic circuit 60. The D32 signal is low if a divider value of 32 has not been selected, which causes the multiplexer 180 to couple the output of the flip-flop 170 to the clock input of a flip-flop 184. However, a periodic signal will not be present at the output of the flip-flop 170 unless a divider value of 64 has been selected. If a divider value of 32 is selected, the D32 signal is high to cause the multiplexer 180 to couple the D-CK signal to the clock input of the flip-flop 184. The flip-flop 184 also includes an inverter 186 coupling output to its data D input to cause the flip-flop 184 to toggle. As explained below, the output of the flip-flop 184 is a periodic signal that has a frequency of either ½ or ¼ the frequency of the D-CK signal depending upon whether the D64 or the D32 signal, respectively, is high.

The output of the flip-flop 184 is applied to a retimer circuit formed by a flip-flop 190. The flip-flop 190 is clocked by the output of an AND-gate 194, which is enabled by the D32-64 signal generated by the control logic circuit 60 (FIG. 3) whenever the divider value is either 32 or 64. In such case, the D-CK signal is coupled through the AND-gate 194 so that the output of the flip-flop 190 transitions high on the first rising edge transition of the D-CK signal after the output of the flip-flop 184 transitions high. The retimer circuit 190 reduces the effects of signal propagation delays in the flip-flops 170, 184, which cause transitions at the output of the flip-flop 184 to be delayed relative to transitions of the D-CK signal at the input to the flip-flop 170. The flip-flop 190 uses the D-CLK signal coupled to the clock input of the flip-flop 190 to synchronize the output of the flip-flop 184 to the transition of the D-CK signal. However, the propagation delays through the flip-flops 170, 184 and the use of the retimer flip-flop 190 to correct those delays is preferable to entirely eliminating propagation delays in the flip-flops 170, 184 even if that could be accomplished. The propagation delays in the flip-flops 170, 184 cause the flip-flops 170, 184 (as well as downstream flip-flops that will be described below) to transition at different times, thereby minimizing power supply noise. If all of the flip-flops in the divider chain 160 transitioned at the same time, the current drawn by the transitioning flip-flops would impart a great deal of noise to power supply circuits (not shown) supplying power to the divider chain 160.

The retimed output from the flip-flop 190 is applied to one input of a multiplexer 200, which has a second input coupled to receive the D-CK signal. The multiplexer 200 is controlled by the D16 signal from the control logic 60 to couple the CK signal to the clock input of a flip-flop 204 whenever the D16 is high responsive to a delay value of 16. If the delay value is 32 or 64, the multiplexer 200 couples the periodic signal present at the output of the flip-flop 190 to the clock input of the flip-flop 204. The multiplexer 200 also couples the output of the flip-flop 190 to the flip-flop 204 if the delay value is 8, 4, 2 or 1. However, since the D-CK signal is only coupled to one of the flip-flops 170, 184 for a delay value of 64 or 32, the output of the flip-flop 190 does not transition if the delay value is less than 32. Therefore, a periodic signal is not present for the multiplexer 200 to couple to the clock input of the flip-flop 204 if the delay value is less than 32.

The flip-flop 204 also toggles because of the presence of the inverter 206 coupled between its output and its data input. The output of the flip-flop 204 is coupled through a multiplexer 210 to the clock input of another flip-flop 214, which also has an inverter 216 coupled from its output to its clock input to cause it to toggle. Again, unless the delay value is 8, the D8 signal generated by the control logic 60 is low to cause the multiplexer 210 to couple the output of the flip-flop 204 to the clock input of the flip-flop 214. If the delay value is 8, the D8 signal is high to cause the multiplexer 210 to couple the D-CK signal directly to the clock input of the flip-flop 214. The flip-flops 204, 214 are reset by an active high INIT-1 signal. As explained above, the INIT-1 signal transitions high during an initialization sequence one period of the D-CK signal after the INIT-2 signal transitions high. Therefore, the flip-flops 204, 214 are reset after the flip-flops 170, 184 are reset. As a result, any effect on the flip-flops 204, 214 resulting from signal transitions caused by resetting the flip-flops 170, 184 are discarded when the flip-flops 204, 214 are subsequently reset.

The output of the flip-flop 214 is coupled to a retimer circuit formed by a flip-flop 220 and an AND-gate 224, which functions in the same manner as the flip-flop 190 and the AND-gate 194 to synchronize the rising edge transition of the signal at the output of the flip-flop 214 to the rising edge transition of the D-CK signal. However, rather than performing this function responsive to the D32-64 signal being high, the AND-gate 224 couples the D-CK signal to the clock input of the flip-flop 220 responsive to the D8-64 signal being high, which occurs whenever the delay value is either 8, 16, 32 or 64.

The output of the flip-flop 220 is applied to one input of a multiplexer 230, which receives the D-CK signal at its other input. The multiplexer 230 is controlled by the D4 signal from the control logic 60 to couple the D-CK signal to the clock input of a flip-flop 234 when a delay value of 4 is selected. Otherwise, the multiplexer 230 couples the output of the retimer flip-flop 220 to the clock input of the flip-flop 234. The flip-flop 234 also has an inverter 238 coupled between its output and its data D input to cause the flip-flop 234 to toggle.

The output of the flip-flop 234 is coupled through a multiplexer 240 to a flip-flop 244, which also has an inverter 248 connected between its output and its data D input. The flip-flop 244 functions in the same manner as the flip-flop 234 except that the D-CK signal is coupled directly to the clock input of the flip-flop 244 responsive to a high D2 signal when a delay value of two is selected.

Unlike the flip-flops "upstream" from the flip-flops 234, 244, the flip-flops 234, 244 may be preset during an initialization sequence to alter the phase of the signal generated at the output of the flip-flop 244. The manner in which the phase is adjusted will be explained below.

The output of the flip-flop 244 is again applied to a retimer flip-flop 250, which receives the D-CK signal through an AND-gate 254 whenever an enable signal EN is high. The output of the flip-flop 250 is applied to the data input of a final retimer flip-flop 260 and through an inverter 264 to the data input of a complementary final retimer flip-flop 268. The clock inputs of the flip-flops 260, 268 are coupled directly to the CK input applied to the inverter 164. As a result, the signal applied to the flip-flops 260, 268 are not significantly loaded by being applied to a large number of circuits, thereby causing the flip-flops 260, 268 to be very closely synchronized to the CK signal.

In operation, one of the D64 through D2 signals is active high to control the location in the divider chain 160 where the D-CK signal is inserted. The D-CK signal then propagates "downstream" through all of the flip-flops between the insertion location and the retimer flip-flop 250. The number of divider flip-flops 170, 184, 204, 214, 234 and 244 through which the D-CK signal is coupled determines the frequency of the signal generated by the four divider circuit. For example, if the D16 signal is high, the D-CK signal is inserted "upstream" from the flip-flop 204, and it then propagates through 4 flip-flops, i.e., flip-flops 204, 214, 234, 244 to divide the frequency of the D-CK signal by $2^4$, i.e., by 16.

As mentioned above, the flip-flops 234, 244 may be preset during an initialization sequence to alter the phase of the signal generated output of the flip-flop 244. As shown in Table 4, during initialization, the flip-flop 244 is reset (nD2-R="0") responsive to a phase command C<1:0> of "0 0" or "0 1," and it is set (nD2-S="0") responsive to a phase command C<1:0> of "1 0" or "1 1." If the flip-flop 244 is set and the divider value is 2, i.e., D2="1," then the output of the flip-flop 244 is initially high, and the signal generated output of the flip-flop 244 will have a phase of 180 degrees. Otherwise, the signal at the output of the flip-flop 244 will have a phase of zero degrees.

For divider value greater than two, the phase of the signal at the output of the flip-flop 244 can be adjusted to one of four phases in a similar manner. A phase command C<1:0> of "0 0" resets the flip-flops 234, 244 during initialization so that the phase of the signal at the output of the flip-flop 244 is zero degrees. If the phase command is "0 1," the flip-flop 234 will be preset but not the flip-flop 244 so that the output of the flip-flop 234 will be initially high and will transition low responsive to the first rising edge coupled to its clock input. The output of the flip-flop 234 will not transition high until after one-quarter of the period of the signal generated at the output of the flip-flop 244 so that the signal at the output of the flip-flop 244 will have a phase of 90 degrees. In response to a phase command of "1 0," only the flip-flop 244 is preset, which causes the signal at the output of the flip-flop 244 to have a phase of 180 degrees. Finally, a phase command of "1 1" causes both of the flip-flops 234, 244 to be preset, which results in the signal output from the flip-flop 244 having a phase of 270 degrees.

It can therefore be seen that, in response to all five bits C<4:0> of the command, the frequency of the complementary signals at the output of the forward divider circuit is equal to the frequency of the CK signal divided by any power of two from 64 to 1, and they may have any quadrature or complementary phase relationship.

Figure 6:
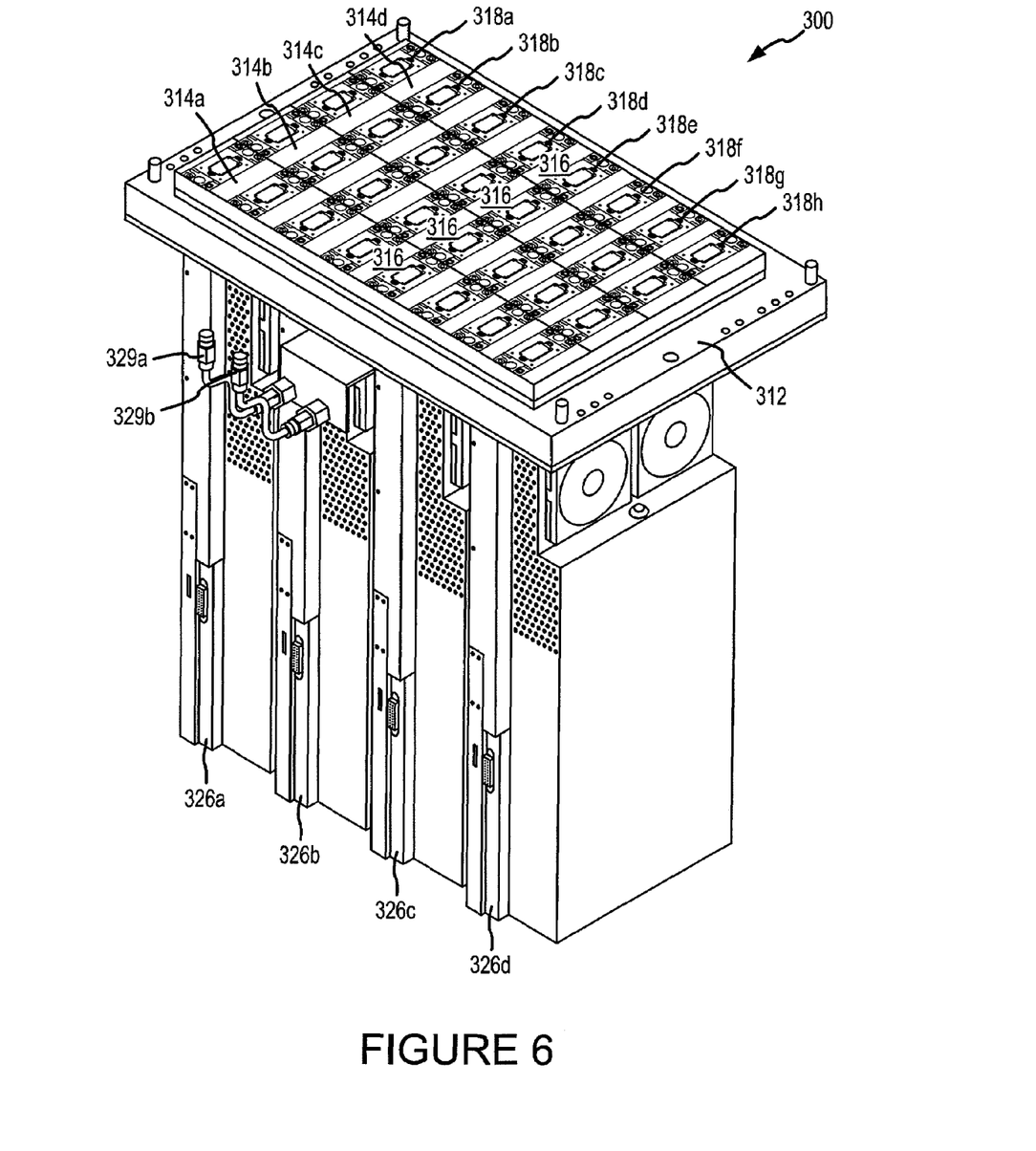
FIG. 6 is an isometric view of a test system using a periodic signal generator according to one example of the invention.

A signal generator according to the disclosed examples of the invention or in accordance with another examples of the invention may be used in a variety of electronic systems, including a system for testing integrated circuits such as memory devices. With reference to FIG. 6, a test system 300 using the signal generator includes a test head 312 on which several load boards 314$a$-$d$ are placed. Each of the load boards 314$a$-$d$ has a printed circuit substrate 316 on which several integrated circuit sockets 318$a$-$h$ are mounted. Each of the integrated circuit sockets 318$a$-$h$ receives a respective integrated circuit (not shown in FIG. 6). In the example shown in FIG. 6, the sockets 318$a$-$h$ are adapted to receive integrated circuit memory devices, such as dynamic random access memory ("DRAM") devices. Prior to final testing of the integrated circuits, an integrated circuit handler loads an integrated circuit into each of the sockets 318$a$-$h$, and then places each of the load boards 314$a$-$d$ on the test head 312.

Figure 7A:
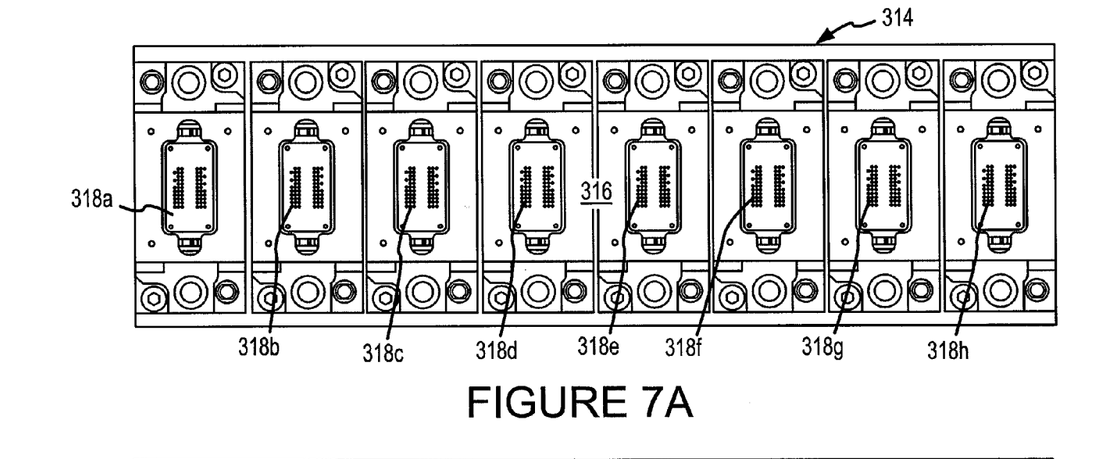
FIGS. 7A and 7B are top and bottom plan views, respectively, of a load board used in the test system of FIG. 6.
Figure 7B:
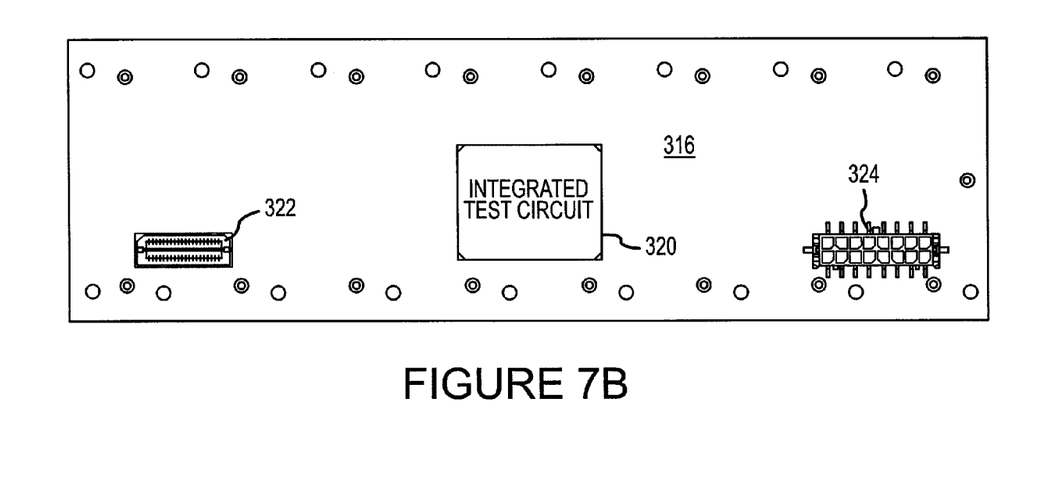

As explained in greater detail below, each of the load boards 314$a$-$d$ includes an integrated device under test ("DUT") chip (not shown in FIG. 6) mounted on the surface of the substrate 316 opposite the service on which the sockets 318$a$-$h$ are mounted. The sockets 318$a$-$h$ are shown mounted on the upper surface of the substrate 316 in greater detail in FIG. 7A. The lower surface of the substrate 316 is shown in FIG. 7B. An integrated test circuit 320 is mounted at the center of the substrate 316, and it is connected to the sockets 318$a$-$h$ through conventional printed circuit traces (not shown in FIG. 7B). Also mounted on the lower surface of the substrate 316 are a conventional JTAG connector 322 and a power supply connector 324. High-level test commands are applied to the test circuit 320 through the JTAG connector 322, and high-level results data are received from the test circuit 320 through the JTAG connector 322. Power is applied to the test circuit 320 as well as to integrated circuits mounted in the sockets 318$a$-$h$ through the power supply connector 324.

In operation, the test circuit 320 applies a pattern of signals to the integrated circuits mounted in the sockets 318$a$-$h$, and receives signals from the integrated circuits indicative of the circuits' response to the pattern of signals. The signals are applied to the integrated circuits in synchronism with a clock signal generated by a clock generator circuit according to one or more examples of the invention, which is fabricated in the test circuit 320. Insofar as the integrated test circuit 320 is mounted on the same substrate 316 as the integrated circuits, the timing at which the pattern of signals are applied to the integrated circuits can be more precisely controlled and more closely synchronized to the clock signal generated by the clock generator circuit. The frequency of the clock signal can be varied over a wide range to perform various testing functions, such as speed grading the integrated circuits. Further, a pair of the clock generator circuits may be fabricated in the integrated test circuit 320 to simultaneously provide in-phase and quadrature clock signals to the integrated circuits.

With further reference to FIG. 6, the test head 312 is mounted on the upper ends of several power supplies 326$a$-$d$, which generate DC supply voltages at respective magnitudes for use by the test head 312 and the load boards 314$a$-$d$. As mentioned above, the DC supply voltages are applied to the test head 312 through the power supply connector 324 (FIG. 7B). The test head 312 also includes fluid couplings 329$a,b$ that receive and discharge a cooling fluid, respectively, for maintaining the temperature of the test circuit 320 at a stable acceptably cool temperature.

From the foregoing it will be appreciated that, although specific embodiments of the invention have been described herein for purposes of illustration, it will be understood by one skilled in the art that various modifications may be made without deviating from the spirit and scope of the invention. For example, although the divider chain 160 shown in FIG. 5 selects the divider value by altering the location at which the D-CK signal is inserted into the divider chain, it will be understood that other techniques may be used to alter the divider value of the divider chain. For example, the number of divider circuits through which the CK signal is coupled may be altered by controlling the location from which the output of the divider chain 160 is taken. Other means of altering the divider number are possible. Accordingly, the invention is not limited except as by the appended claims.

What is claimed is:

1. A forward divider circuit, comprising:
 a divider chain including a plurality of divider circuits coupled in series with each other from a first divider circuit to a last divider circuit, the plurality of divider circuits being structured to receive an input clock signal and to generate from the input clock signal an output clock signal having a frequency that is determined by the frequency of the input clock signal and the number of the divider circuits through which the input clock signal is coupled to generate the output clock signal, the divider chain being structured to adjust the phase of the output clock signal to one of a plurality of phase values; and
 at least one retimer circuit coupled from an output of one of the divider circuits to an input of another of the divider circuits, the at least one retimer circuit being structured to receive a signal from the output of the one divider circuit and to couple the signal to the input of the other divider circuit in synchronism with a retimer signal.

2. The forward divider circuit of claim 1 wherein the retimer signal comprises the input clock signal.

3. The forward divider circuit of claim 1 wherein the output clock signal is generated by the last divider circuit, and wherein the number of the divider circuits through which the input clock signal is coupled to generate the output clock signal is adjusted by adjusting the divider circuit to which the input clock signal is applied.

4. The forward divider chain of claim 1 wherein the divider chain is structured to adjust the phase of the output clock signal by presetting at least one of the divider circuits to a respective state.

5. The forward divider circuit of claim 1 wherein each of the divider circuits comprises:
a flip-flop having a clock input, a data input and an output; and
an inverter having an input coupled to the output of the flip-flop and an output coupled to the data input of the flip-flop, the flip-flop further having its clock input coupled to receive the signal applied to the divider circuit.

6. The forward divider circuit of claim 5, further comprising a multiplexer having a first input coupled to receive a signal from the output of one of the flip-flops, a second input coupled to receive the input clock signal, and an output coupled to the clock input of another of the flip-flops, the multiplexer being structured to be controlled by a control signal indicative of the number of the divider circuits through which the input clock signal is coupled to generate the output clock signal.

7. The forward divider circuit of claim 5, further comprising a gate having a first input coupled to receive the input clock signal, a second input coupled to receive a signal indicative of the number of the divider circuits through which the input clock signal is coupled to generate the output clock signal, and an output coupled to the clock input of one of the flip-flops, the gate being structured to selectively couple the input clock signal to the clock input of the one of the flip-flops.

8. The forward divider circuit of claim 1, further comprising a differential amplifier receiving a differential clock signal at first and second inputs, the differential amplifier being structured to generate the input clock signal from the differential clock signal as a single-ended clock signal.

9. The forward divider circuit of claim 1 wherein the at least one retimer circuit comprises a respective flip-flop having a clock input, a data input and an output, the data input of the flip-flop being coupled to receive the output of the one of the divider circuits, the clock input coupled to receive the retimer signal, and the output of the flip-flop being coupled to the input of the other of the divider circuits.

10. The forward divider circuit of claim 1, further comprising an initialization circuit, the initialization circuit being structured to place each of the divider circuits in an initial state responsive to an initialization signal.

11. The forward divider circuit of claim 10 wherein the initialization circuit is structured to place upstream divider circuits through which higher frequency signals are coupled in the initial state prior to placing downstream divider circuits through which lower frequency signals are coupled in the initial state so that any effect on the downstream divider circuits by signal transitions in the upstream divider circuits resulting from placing the upstream divider circuits in the initial state are eliminated by subsequently placing the downstream divider circuits in the initial state.

12. A forward divider circuit, comprising a divider chain including a plurality of divider circuits coupled in series with each other from a first divider circuit to a last divider circuit, the plurality of divider circuits being structured to receive an input clock signal and to generate from the input clock signal an output clock signal having a frequency that is determined by the frequency of the input clock signal and the number of the divider circuits through which the input clock signal is coupled to generate the output clock signal, the divider chain further being operable to adjust the phase of the output clock signal to one of a plurality of phase values.

13. The forward divider chain of claim 12 wherein the divider chain is structured to adjust the phase of the output clock signal by presetting at least one of the divider circuits to a respective state.

14. The forward divider chain of claim 13 wherein each of the divider circuits comprises:
a flip-flop having a clock input, a data input and an output; and
an inverter having an input and an output; and
a flip-flop having a clock input coupled to receive the signal applied to the divider circuit, a data input coupled to the output of the inverter, and an output coupled to the input of the inverter, the flip-flop being structured to be preset during an initialization procedure to adjust the phase of the output clock signal.

15. The forward divider circuit of claim 14, further comprising a multiplexer having a first input coupled to receive a signal from the output of one of the flip-flops, a second input coupled to receive the input clock signal, and an output coupled to the clock input of another of the flip-flops, the multiplexer being structured to be controlled by a control signal indicative of the number of the divider circuits through which the input clock signal is coupled to generate the output clock signal.

16. The forward divider circuit of claim 14, further comprising a gate having a first input coupled to receive the input clock signal, a second input coupled to receive a signal indicative of the number of the divider circuits through which the input clock signal is coupled to generate the output clock signal, and an output coupled to the clock input of one of the flip-flops, the gate being structured to selectively couple the input clock signal to the clock input of the one of the flip-flops.

17. The forward divider chain of claim 13 wherein a divider circuit from which the output clock signal is generated comprises a first flip-flop, and the divider circuit applying a signal to the first flip-flop comprises a second flip-flop, the output signal having a phase of zero degrees when neither the first flip-flop nor the second flip-flop is preset, the output signal having a phase of 90 degrees when the second flip-flop but not the first flip-flop is preset, the output signal having a phase of 180 degrees when the first flip-flop but not the second flip-flop is preset, and the output signal having a phase of 270 degrees when both the second flip-flop and the first flip-flop are preset.

18. The forward divider circuit of claim 12 wherein the output clock signal is generated by the last divider circuit, and wherein the number of the divider circuits through which the input clock signal is coupled to generate the output clock signal is adjusted by adjusting the divider circuit to which the input clock signal is applied.

19. The forward divider circuit of claim 12, further comprising a differential amplifier receiving a differential clock signal at first and second inputs, the differential amplifier being structured to generate the input clock signal from the differential clock signal as a single-ended clock signal.

20. The forward divider circuit of claim 12, further comprising an initialization circuit, the initialization circuit being structured to place each of the divider circuits in an initial state and to adjust the divider circuits in a condition so that the phase of the output clock signal has one of the plurality of phase values responsive to an initialization signal.

21. The forward divider circuit of claim 20 wherein the initialization circuit is structured to place upstream divider circuits through which higher frequency signals are coupled in the initial state prior to placing downstream divider circuits through which lower frequency signals are coupled in the initial state so that any effect on the downstream divider circuits by signal transitions in the upstream divider circuits resulting from placing the upstream divider circuits in the initial state are eliminated by subsequently placing the downstream divider circuits in the initial state.

22. An integrated circuit testing device, comprising:
   a test circuit being operable to output test signals in synchronism with a clock signal and to receive response signals, the test circuit having an output port from which test results data derived from the response signals are output; and
   a signal generator structured to generate the clock signal, the signal generator comprising:
   a divider chain including a plurality of divider circuits coupled in series with each other from a first divider circuit to a last divider circuit, the plurality of divider circuits being structured to receive a periodic input signal and to generate from the periodic input signal the clock signal with a frequency that is determined by the frequency of the periodic input signal and the number of the divider circuits through which the periodic input signal is coupled to generate the clock signal, the divider chain being structured to adjust the phase of the output clock signal to one of a plurality of phase values; and
   at least one retimer circuit coupled from an output of one of the divider circuits to an input of another of the divider circuits, the at least one retimer circuit being structured to receive a signal from the output of the one divider circuit and to couple the signal to the input of the other divider circuit in synchronism with a retimer signal.

23. The integrated circuit testing device of claim 22 wherein the retimer signal comprises the periodic input signal.

24. The integrated circuit testing device of claim 22 wherein the clock signal is generated by the last divider circuit, and wherein the number of the divider circuits through which the periodic input signal is coupled to generate the clock signal is adjusted by adjusting the divider circuit to which the periodic input signal is applied.

25. The integrated circuit testing device of claim 22 wherein each of the divider circuits comprises:
   a flip-flop having a clock input, a data input and an output; and
   an inverter having an input coupled to the output of the flip-flop and an output coupled to the data input of the flip-flop, the flip-flop further having its clock input coupled to receive the signal applied to the divider circuit.

26. The integrated circuit testing device of claim 25, further comprising a multiplexer having a first input coupled to receive a signal from the output of one of the flip-flops, a second input coupled to receive the periodic input signal, and an output coupled to the clock input of another of the flip-flops, the multiplexer being structured to be controlled by a control signal indicative of the number of the divider circuits through which the periodic input signal is coupled to generate the clock signal.

27. The integrated circuit testing device of claim 25, further comprising a gate having a first input coupled to receive the periodic input signal, a second input coupled to receive a signal indicative of the number of the divider circuits through which the periodic input signal is coupled to generate the clock signal, and an output coupled to the clock input of one of the flip-flops, the gate being structured to selectively couple the periodic input signal to the clock input of the one of the flip-flops.

28. The integrated circuit testing device of claim 22 wherein the at least one retimer circuit comprises a respective flip-flop having a clock input, a data input and an output, the data input of the flip-flop being coupled to receive the output of the one of the divider circuits, the clock input coupled to receive the retimer signal, and the output of the flip-flop being coupled to the input of the other of the divider circuits.

29. The integrated circuit testing device of claim 22, further comprising an initialization circuit structured to place upstream divider circuits through which higher frequency signals are coupled in an initial state prior to placing downstream divider circuits through which lower frequency signals are coupled in the initial state so that any effect on the downstream divider circuits by signal transitions in the upstream divider circuits resulting from placing the upstream divider circuits in the initial state are eliminated by subsequently placing the downstream divider circuits in the initial state.

30. An integrated circuit testing device, comprising:
   a test circuit structured to output test signals in synchronism with a clock signal and to receive response signals, the test circuit having an output port from which test results data derived from the response signals are output; and
   a signal generator structured to generate the clock signal, the signal generator comprising a divider chain including a plurality of divider circuits coupled in series with each other from a first divider circuit to a last divider circuit, the plurality of divider circuits being structured to receive a periodic input signal and to generate from the periodic input signal the clock signal with a frequency that is determined by the frequency of the periodic input signal and the number of the divider circuits through which the periodic input signal is coupled to generate the clock signal, the divider chain further being operable to adjust the phase of the clock signal to one of a plurality of phase values.

31. The integrated circuit testing device of claim 30 wherein the divider chain is structured to adjust the phase of the clock signal by presetting at least one of the divider circuits to a respective state.

32. The integrated circuit testing device of claim 31 wherein each of the divider circuits comprises:
   a flip-flop having a clock input, a data input and an output; and
   an inverter having an input and an output; and
   a flip-flop having a clock input coupled to receive the signal applied to the divider circuit, a data input coupled to the output of the inverter, and an output coupled to the input of the inverter, the flip-flop being structured to be preset during an initialization procedure to adjust the phase of the clock signal.

33. The integrated circuit testing device of claim 31 wherein a divider circuit from which the clock signal is generated comprises a first flip-flop, and the divider circuit applying a signal to the first flip-flop comprises a second flip-flop, the output signal having a phase of zero degrees when neither the first flip-flop nor the second flip-flop is preset, the output signal having a phase of 90 degrees when the second flip-flop but not the first flip-flop is preset, the output signal having a phase of 180 degrees when the first flip-flop but not the second flip-flop is preset, and the output signal having a phase of 270 degrees when both the second flip-flop and the first flip-flop are preset.

34. The integrated circuit testing device of claim 30 wherein the clock signal is generated by the last divider circuit, and wherein the number of the divider circuits through which the periodic input signal is coupled to generate the clock signal is adjusted by adjusting the divider circuit to which the periodic input signal is applied.

35. The integrated circuit testing device of claim 30, further comprising an initialization circuit structured to place upstream divider circuits through which higher frequency signals are coupled in an initial state prior to placing downstream divider circuits through which lower frequency signals are coupled in the initial state so that any effect on the downstream divider circuits by signal transitions in the upstream divider circuits resulting from placing the upstream divider circuits in the initial state are eliminated by subsequently placing the downstream divider circuits in the initial state.

36. An integrated circuit load board, comprising:
a substrate;
a plurality of integrated circuit sockets mounted on the substrate; and
an integrated test circuit mounted on the substrate and coupled to the integrated circuit sockets, the integrated test circuit being structured to output test signals to the integrated circuit sockets in synchronism with a clock signal coupled to the integrated circuit sockets and to receive response signals from the integrated circuit sockets, the test circuit having an output port for test results data derived from the response signals, the integrated test circuit including a signal generator structured to generate the clock signal, the signal generator comprising:
a divider chain including a plurality of divider circuits coupled in series with each other from a first divider circuit to a last divider circuit, the plurality of divider circuits being structured to receive a periodic input signal and to generate from the periodic input signal the clock signal with a frequency that is determined by the frequency of the periodic input signal and the number of the divider circuits through which the periodic input signal is coupled to generate the clock signal, the divider chain being structured to adjust the phase of the output clock signal to one of a plurality of phase values; and
at least one retimer circuit coupled from an output of one of the divider circuits to an input of another of the divider circuits, the at least one retimer circuit being structured to receive a signal from the output of the one divider circuit and to couple the signal to the input of the other divider circuit in synchronism with a retimer signal.

37. The integrated circuit load board of claim 36 wherein the retimer signal comprises the periodic input signal.

38. The integrated circuit load board of claim 36 wherein the clock signal is generated by the last divider circuit, and wherein the number of the divider circuits through which the periodic input signal is coupled to generate the clock signal is adjusted by adjusting the divider circuit to which the periodic input signal is applied.

39. The integrated circuit load board of claim 36 wherein the divider chain is further structured to adjust the phase of the clock signal to one of a plurality of phase values by presetting at least one of the divider circuits to a respective state.

40. The integrated circuit load board of claim 36, further comprising a multiplexer having a first input coupled to receive a signal from the output of one of the flip-flops, a second input coupled to receive the periodic input signal, and an output coupled to the clock input of another of the flip-flops, the multiplexer being structured to be controlled by a control signal indicative of the number of the divider circuits through which the periodic input signal is coupled to generate the clock signal.

41. The integrated circuit load board of claim 36, further comprising a gate having a first input coupled to receive the periodic input signal, a second input coupled to receive a signal indicative of the number of the divider circuits through which the periodic input signal is coupled to generate the clock signal, and an output coupled to the clock input of one of the flip-flops, the gate being structured to selectively couple the periodic input signal to the clock input of the one of the flip-flops.

42. The integrated circuit load board of claim 36 wherein the at least one retimer circuit comprises a respective flip-flop having a clock input, a data input and an output, the data input of the flip-flop being coupled to receive the output of the one of the divider circuits, the clock input coupled to receive the retimer signal, and the output of the flip-flop being coupled to the input of the other of the divider circuits.

43. The integrated circuit load board of claim 36, further comprising an initialization circuit, the initialization circuit being structured to place upstream divider circuits through which higher frequency signals are coupled in an initial state prior to placing downstream divider circuits through which lower frequency signals are coupled in the initial state so that any effect on the downstream divider circuits by signal transitions in the upstream divider circuits resulting from placing the upstream divider circuits in the initial state are eliminated by subsequently placing the downstream divider circuits in the initial state.

44. An integrated circuit load board, comprising:
a substrate;
a plurality of integrated circuit sockets mounted on the substrate; and
an integrated test circuit mounted on the substrate and coupled to the integrated circuit sockets, the integrated test circuit being structured to output test signals to the integrated circuit sockets in synchronism with a clock signal coupled to the integrated circuit sockets and to receive response signals from the integrated circuit sockets, the test circuit having an output port for test results data derived from the response signals, the integrated test circuit including a signal generator structured to generate the clock signal, the signal generator comprising a divider chain including a plurality of divider circuits coupled in series with each other from a first divider circuit to a last divider circuit, the plurality of divider circuits being structured to receive a periodic input signal and to generate from the periodic input signal the clock signal with a frequency that is determined by the frequency of the periodic input signal and the number of the divider circuits through which the periodic input signal is coupled to generate the clock signal, the divider chain further being operable to adjust the phase of the clock signal to one of a plurality of phase values.

45. The integrated circuit load board of claim 44 wherein the divider chain is structured to adjust the phase of the clock signal by presetting at least one of the divider circuits to a respective state.

46. The integrated circuit load board of claim 45 wherein each of the divider circuits comprises:
a flip-flop having a clock input, a data input and an output; and
an inverter having an input and an output; and
a flip-flop having a clock input coupled to receive the signal applied to the divider circuit, a data input coupled to the output of the inverter, and an output coupled to the input of the inverter, the flip-flop being structured to be preset during an initialization procedure to adjust the phase of the clock signal.

47. The integrated circuit load board of claim 45 wherein a divider circuit from which the clock signal is generated comprises a first flip-flop, and the divider circuit applying a signal to the first flip-flop comprises a second flip-flop, the output signal having a phase of zero degrees when neither the first flip-flop nor the second flip-flop is preset, the output signal having a phase of 90 degrees when the second flip-flop but not the first flip-flop is preset, the output signal having a phase of 180 degrees when the first flip-flop but not the second flip-flop is preset, and the output signal having a phase of 270 degrees when both the second flip-flop and the first flip-flop are preset.

48. The integrated circuit load board of claim 44 wherein the clock signal is generated by the last divider circuit, and wherein the number of the divider circuits through which the periodic input signal is coupled to generate the clock signal is adjusted by adjusting the divider circuit to which the periodic input signal is applied.

49. The integrated circuit load board of claim 44, further comprising an initialization circuit, the initialization circuit being structured to place upstream divider circuits through which higher frequency signals are coupled in an initial state prior to placing downstream divider circuits through which lower frequency signals are coupled in the initial state so that any effect on the downstream divider circuits by signal transitions in the upstream divider circuits resulting from placing the upstream divider circuits in the initial state are eliminated by subsequently placing the downstream divider circuits in the initial state.

50. A method of generating an output clock signal by coupling an input clock signal through a plurality of divider circuits so that the output clock signal has a frequency that is determined by the frequency of the input clock signal and the number of the divider circuits through which the input clock signal is coupled to generate the output clock signal, the method comprising:
   synchronizing a first signal coupled from an output of one of the divider circuits to an input of another of the divider circuits with a retimer signal by causing the first signal to transition at substantially the same time that the retimer signal transitions; and
   adjusting the phase of the output clock signal to one of a plurality of phase values by placing at least some of the divider circuits in a predetermined state prior to coupling the input clock signal through the divider circuits.

51. The method of claim 50 wherein the retimer signal comprises the input clock signal.

52. The method of claim 50 further comprising changing the frequency of the output clock signal by changing the number of the divider circuits through which the input clock signal is coupled to generate the output clock signal.

53. The method of claim 52 wherein the act of changing the number of the divider circuits through which the input clock signal is coupled comprises changing the divider circuit to which the input clock signal is applied.

54. The method of claim 50 wherein the act of placing at least some of the divider circuits in a predetermined state comprises placing upstream divider circuits through which higher frequency signals are coupled in the predetermined state prior to placing downstream divider circuits through which lower frequency signals are coupled in the predetermined state so that any effect on the downstream divider circuits by signal transitions in the upstream divider circuits resulting from placing the upstream divider circuits in the predetermined state are eliminated by subsequently placing the downstream divider circuits in the initial state.

55. A method of generating an output clock signal by coupling an input clock signal through a plurality of divider circuits so that the output clock signal has a frequency that is determined by the frequency of the input clock signal and the number of the divider circuits through which the input clock signal is coupled to generate the output clock signal, the method comprising controlling the phase of the output clock signal to one of a plurality of phase values.

56. The method of claim 55 wherein the act of controlling the phase of the output clock signal to one of a plurality of phase values comprises presetting at least one of the divider circuits to a predetermined state.

57. The method of claim 55 further comprising changing the frequency of the output clock signal by changing the number of the divider circuits through which the input clock signal is coupled to generate the output clock signal.

58. The method of claim 57 wherein the act of changing the number of the divider circuits through which the input clock signal is coupled comprises changing the divider circuit to which the input clock signal is applied.

59. The method of claim 55, further comprising initializing each of the divider circuit by placing each of the divider circuits in a predetermined state prior to coupling the input clock signal through the divider circuits.

60. The method of claim 59 wherein the act of placing each of the divider circuits in a predetermined state comprises placing upstream divider circuits through which higher frequency signals are coupled in the predetermined state prior to placing downstream divider circuits through which lower frequency signals are coupled in the predetermined state so that any effect on the downstream divider circuits by signal transitions in the upstream divider circuits resulting from placing the upstream divider circuits in the predetermined state are eliminated by subsequently placing the downstream divider circuits in the initial state.

61. A forward divider circuit, comprising:
   a divider chain including a plurality of divider circuits coupled in series with each other from a first divider circuit to a last divider circuit, the plurality of divider circuits being structured to receive an input clock signal and to generate from the input clock signal an output clock signal having a frequency that is determined by the frequency of the input clock signal and the number of the divider circuits through which the input clock signal is coupled to generate the output clock signal;
   at least one retimer circuit coupled from an output of one of the divider circuits to an input of another of the divider circuits, the at least one retimer circuit being structured to receive a signal from the output of the one divider circuit and to couple the signal to the input of the other divider circuit in synchronism with a retimer signal; and
   an initialization circuit structured to place each of the divider circuits in an initial state responsive to an initialization signal, the initialization circuit being structured to place upstream divider circuits through which higher frequency signals are coupled in the initial state prior to placing downstream divider circuits through which lower frequency signals are coupled in the initial state so that any effect on the downstream divider circuits by signal transitions in the upstream divider circuits resulting from placing the upstream divider circuits in the initial state are eliminated by subsequently placing the downstream divider circuits in the initial state.

62. The forward divider circuit of claim 61 wherein the output clock signal is generated by the last divider circuit, and wherein the number of the divider circuits through which the input clock signal is coupled to generate the output clock signal is adjusted by adjusting the divider circuit to which the input clock signal is applied.

63. The forward divider circuit of claim 61 wherein each of the divider circuits comprises:

a flip-flop having a clock input, a data input and an output; and an inverter having an input coupled to the output of the flip-flop and an output coupled to the data input of the flip-flop, the flip-flop further having its clock input coupled to receive the signal applied to the divider circuit.

64. The forward divider circuit of claim 63, further comprising a multiplexer having a first input coupled to receive a signal from the output of one of the flip-flops, a second input coupled to receive the input clock signal, and an output coupled to the clock input of another of the flip-flops, the multiplexer being structured to be controlled by a control signal indicative of the number of the divider circuits through which the input clock signal is coupled to generate the output clock signal.

65. The forward divider circuit of claim 63, further comprising a gate having a first input coupled to receive the input clock signal, a second input coupled to receive a signal indicative of the number of the divider circuits through which the input clock signal is coupled to generate the output clock signal, and an output coupled to the clock input of one of the flip-flops, the gate being structured to selectively couple the input clock signal to the clock input of the one of the flip-flops.

66. The forward divider circuit of claim 61, further comprising a differential amplifier receiving a differential clock signal at first and second inputs, the differential amplifier being structured to generate the input clock signal from the differential clock signal as a single-ended clock signal.

67. The forward divider circuit of claim 61 wherein the at least one retimer circuit comprises a respective flip-flop having a clock input, a data input and an output, the data input of the flip-flop being coupled to receive the output of the one of the divider circuits, the clock input coupled to receive the retimer signal, and the output of the flip-flop being coupled to the input of the other of the divider circuits.

* * * * *